US006744548B2

(12) United States Patent
Abeles

(10) Patent No.: US 6,744,548 B2
(45) Date of Patent: Jun. 1, 2004

(54) RESONANT ENHANCED MODULATOR (REM)

(75) Inventor: Joseph H. Abeles, Highland Park, NJ (US)

(73) Assignee: Princeton Lightwave, Inc., Cranbury, NJ (US)

( * ) Notice: Subject to any disclaimer, the term of this patent is extended or adjusted under 35 U.S.C. 154(b) by 0 days.

(21) Appl. No.: 10/181,540

(22) PCT Filed: Jan. 22, 2001

(86) PCT No.: PCT/US01/02070

§ 371 (c)(1),
(2), (4) Date: Nov. 13, 2002

(87) PCT Pub. No.: WO01/53881

PCT Pub. Date: Jul. 26, 2001

(65) Prior Publication Data

US 2003/0133176 A1 Jul. 17, 2003

Related U.S. Application Data

(60) Provisional application No. 60/176,915, filed on Jan. 20, 2000.

(51) Int. Cl.$^7$ .............................. G02F 1/07; H04B 10/04
(52) U.S. Cl. ........................ 359/254; 359/237; 359/245; 398/183; 398/188
(58) Field of Search ................................. 359/240, 321, 359/322, 275, 276, 254, 237, 238, 245; 250/227.19, 227.12, 227.27; 356/450; 385/2, 3, 9

(56) References Cited

U.S. PATENT DOCUMENTS

| 4,709,978 | A | 12/1987 | Jackel | 350/96.14 |
| 5,291,565 | A | 3/1994 | Schaffner et al. | 385/3 |
| 6,009,115 | A | 12/1999 | Ho | 372/92 |
| 6,052,495 | A | 4/2000 | Little et al. | 385/2 |
| 6,078,605 | A | 6/2000 | Little et al. | 372/94 |
| 6,175,446 | B1 | 1/2001 | Alphonse | 359/344 |
| 6,198,854 | B1 | 3/2001 | Takagi | 385/2 |

OTHER PUBLICATIONS

"General IIR Optical Filter Design for WDM Applications Using All–Pass Filters", C.K. Madsen, Journal of Lightwave Technology, vol. 18, No. 6, Jun. 2000, IEEE, pp. 860–868.

"Compact Microring Notch Filters", P.P. Absi et al., IEEE Photonics Technology Letters, vol. 12, No. 4, Apr. 2000, pp. 398–399.

Primary Examiner—Georgia Epps
Assistant Examiner—M. Hasan
(74) Attorney, Agent, or Firm—Duane Morris LLP

(57) ABSTRACT

A modulator including: a plurality of branches; first and second RF electrodes; a first plurality of RF delay elements coupled to the first RF electrode and a second plurality of RF delay elements coupled to the second electrode; and, a plurality of electro-refractive resonant elements. Each of the electro-refractive resonant elements is respectively coupled to a corresponding one of the RF delay elements and evanescently coupled to at least one of the branches.

10 Claims, 12 Drawing Sheets

RESONANT ENHANCED MODULATOR (REM)

RELATED APPLICATION

This application claims benefit of U.S. provisional patent application serial No. 60/176,915, entitled "CHANNELIZER SWITCH" filed Jan. 20, 2000.

FIELD OF INVENTION

The present invention relates generally to digital communications and networking technologies and analog technologies such as radar and particularly to modulator components therefor.

BACKGROUND OF INVENTION

It is an object of the present invention to provide advanced modulators whose high efficiency will permit superior digital telecommunications systems to be developed and commercialized. It is further an object of the present invention to provide advanced modulators whose high efficiency; and small size and weight, will enable radar imaging techniques to be deployed more widely and more flexibly in support of operations. It is a further object of the present invention that these modulator components permit the received radar return signal to be acquired directly, eliminating the need for amplification. It is further an object of the present invention that the receive array circuitry be integrated and packaged in a single compact receive module.

SUMMARY OF INVENTION

A modulator including: a plurality of branches; first and second RF electrodes; a first plurality of RF delay elements coupled to the first RF electrode and a second plurality of RF delay elements coupled to the second electrode; and, a plurality of electro-optic resonant elements each being respectively coupled for RF frequency energy exchange with a corresponding one of the RF delay elements and coupled for optical frequency electromagnetic energy exchange to at least one of the branches.

DETAILED DESCRIPTION OF THE PREFERRED EMBODIMENT

Figure 1:
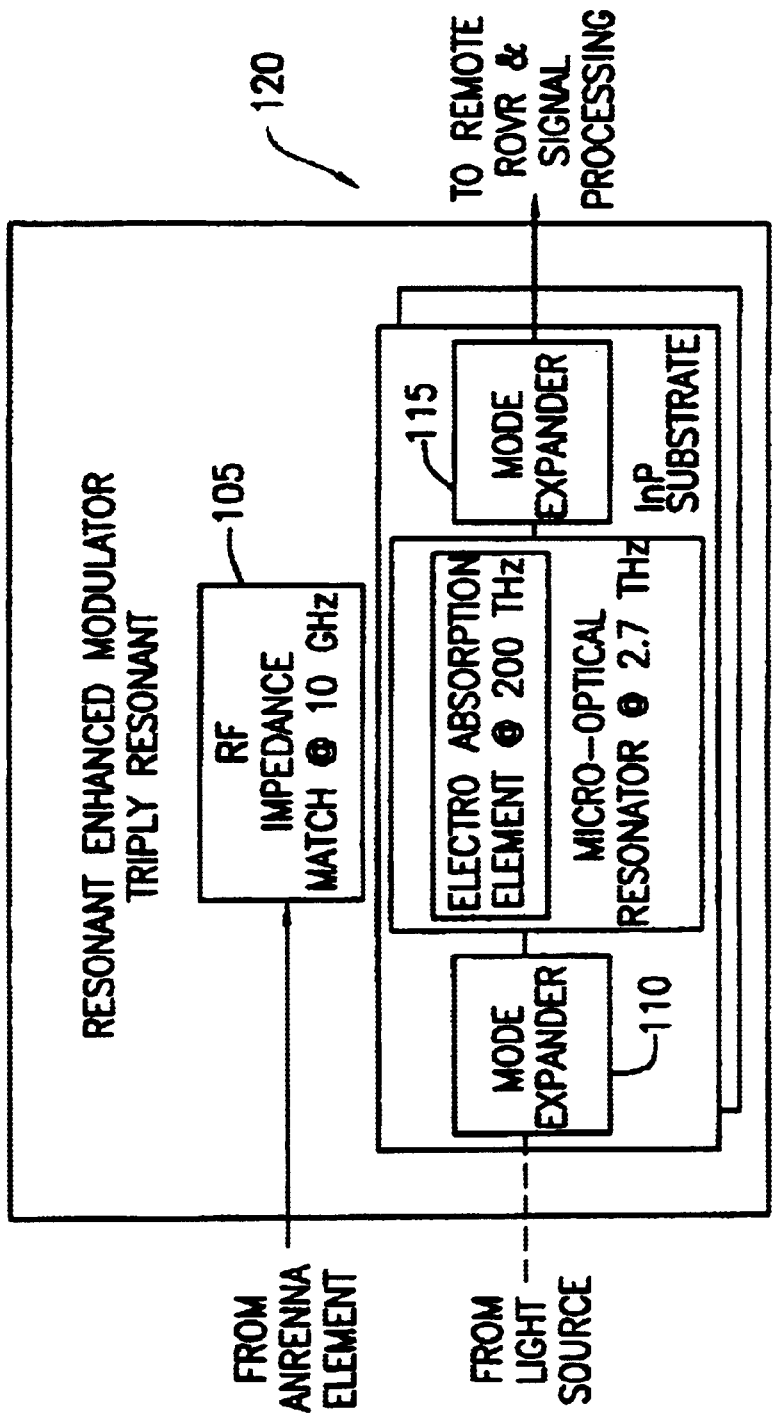
FIG. 1 illustrates a Resonant Enhanced Modulator (REM) according to an aspect of the present invention.

Tenth-volt-class optical modulators are highly desirable for high speed digital modulation at speeds of, e.g., 40 Gb/s and higher, in order to reduce the requirement for power dissipation on the part of the drive electronics. Tenth-volt-class optical modulators are essential for the remoting of systems integrator receive arrays if multi-kW dissipation using existing links is to be reduced. Modulators with 25 mV equivalent $V_\pi$ permit receive arrays to operate without the use of low-noise pre-amplifiers.

Micro-ring resonators of substantially 10 μm diameter or less enable a small electrode to effect changes in phase or in amplitude equivalent to that of a much larger conventional electro-absorption or electro-refractive modulator of the same bandwidth, while attaining sufficient bandwidths for operation at X-band and higher frequencies, and permitting sufficiently low noise figures.

Arraying of multiple micro-ring resonators, in which each provides only a small portion of the overall modulation, can advantageously achieve significant reductions in voltage. This strategy can be employed both for electro-absorptive (EA) and electro-refractive (ER) configurations. ER configurations are superior at high optical powers as is necessary for low analog link noise figures. The ER configuration allows shot-noise-limited (i.e., low-noise) transmission of the received antenna signal to a receive module.

It is an additional feature of the present invention that series cascading of multiple ER resonant elements does not result in a narrowing of the pass bandwidth of the resonant elements, whereas series cascading of multiple EA resonant elements causes a progressive narrowing of the maximum bandwidth of the modulated signal passing through the circuit. Therefore, in the case of a cascade of EA resonant modulating elements, possible advantages associated with increased sensitivity are offset, at least in part, by a narrowing of bandwidth. The same narrowing does not occur for ER cascades. Therefore in the preferred embodiment of the present invention, a cascade of ER resonant elements is employed and EA behavior is eschewed. According to the present invention, a substantial advantage in modulator sensitivity is attained by exploiting multiple resonances. The invention shall be described to include three separate resonances, which cause the maximum sensitivity to be obtained. However, one of these three resonances as shall be described causes the modulator to exhibit a peak in sensitivity at a microwave drive frequency. This is desirable for certain RF applications, such as radar applications mentioned above. However, for standard baseband digital telecommunications applications, it is not desirable that modulator response be peaked at any particular RF frequency. Therefore, there is a second desirable embodiment which inherently is more desirable for baseband applications, i.e., those for which modulation efficiency is desired to be equally high from near DC to the maximum frequency of operation. The parameter commonly employed by workers in the field denoting sensitivity of modulators is called "$V_{90}$," which in turn denotes the voltage range over which the modulator can be adjusted from a maximally transparent condition to a maximally opaque condition. For the aforementioned second embodiment, only two resonances are employed yet substantial advantage over prior art modulators is nevertheless obtained in that a 0.1-Volt-class $V_\pi$ performance is obtained.

According to one aspect of the present invention, a 0.01-V-class X-band resonant enhanced modulator (REM) module demonstrating $\geq 100$ times reduction in modulation voltage at either 1.31 μm or 1.55 μm, and $\geq 10^4$ times increase in link sensitivity over current performance standards is provided.

Conventional modulators are singly-(semiconductor) or non-($LiNbO_3$) resonant, whereas REMs of the first preferred embodiment exploit three resonances at: (a) the ~200 THz bandgap; (b) a ~2.7 THz resonator free-spectral-range; and (c) a 10 GHz frequency match. According to another aspect of the present invention, optimized REMs exhibit $V_\pi = 0.02$ V over the system-defined 8–12 GHz band by exploiting resonant reductions in capacitance and drive voltage.

According to another aspect of the present invention, the present invention builds upon ring resonator technology. The design is based on: (1) low-loss 10–100 μm semiconductor, such as InGaAsP, ring resonators and directional couplers; (2) adiabatic mode-expanders; and (3) low-parasitic microstrip matching networks to arrays of ring devices. These respectively provide (1) bandwidths adequate for X-band; (2) 6 dB fiber-to-fiber insertion loss; and (3) impedance transformation of low-capacitance high-impedance rings to $\leq 0.2V$ at $50\Omega$.

Ring resonators are discussed in U.S. Pat. No. 6,009,115, entitled "SEMICONDUCTOR MICRO-RESONATOR DEVICE" and issued Dec. 28, 1999 for example. Resonator modulators and wavelength routing switches are discussed in U.S. Pat. No. 6,052,495, issued Apr. 18, 2000 and entitled "RESONATOR MODULATORS AND WAVELENGTH ROUTING SWITCHES". The entire disclosures of U.S. Pat. Nos. 6,009,115 and 6,052,495 are hereby incorporated by reference herein.

Propagation losses in the micro-optical ring resonators are one of the key issues for the success of this approach. Therefore the present invention further builds upon low-loss waveguides for active, laser and amplifier structures where passive propagation loss values of 1 $cm^{-1}$ has been achieved. According to another aspect of the present invention, since those laser structures are flooded with carriers, substantially lower background losses can be achieved in reverse-biased, carrier-free modulator waveguides. According to another aspect of the invention, tailing interband optical absorption losses should be minimized by choice of operating wavelength.

Modulation efficiency is the primary limiting factor preventing deployment of compact advanced radar imaging systems. Modulated capacitance $C_m$ is a primary factor limiting the efficiency of conventional EA modulators. Resonant enhancement provides a dramatic reduction in $C_m$ compared to a single-pass modulator of equivalent bandwidth. For a 15 GHz bandwidth, the comparison is $C_m^{EAM} > 0.40$ pF for a conventional modulator vs. $C_m^{REM} < 0.02$ pF for the REM. Referring now to FIG. 1, according to another aspect of the invention, hybrid matching circuits 105, 110, 115 are used to match impedances and enhance voltage response over the system frequency band.

With a 10 times capacitance reduction, and other benefits such as the relatively small size of the REM 120, the conventional ~1 V requirement is advantageously lessened to ~0.01 V.

Figure 2:
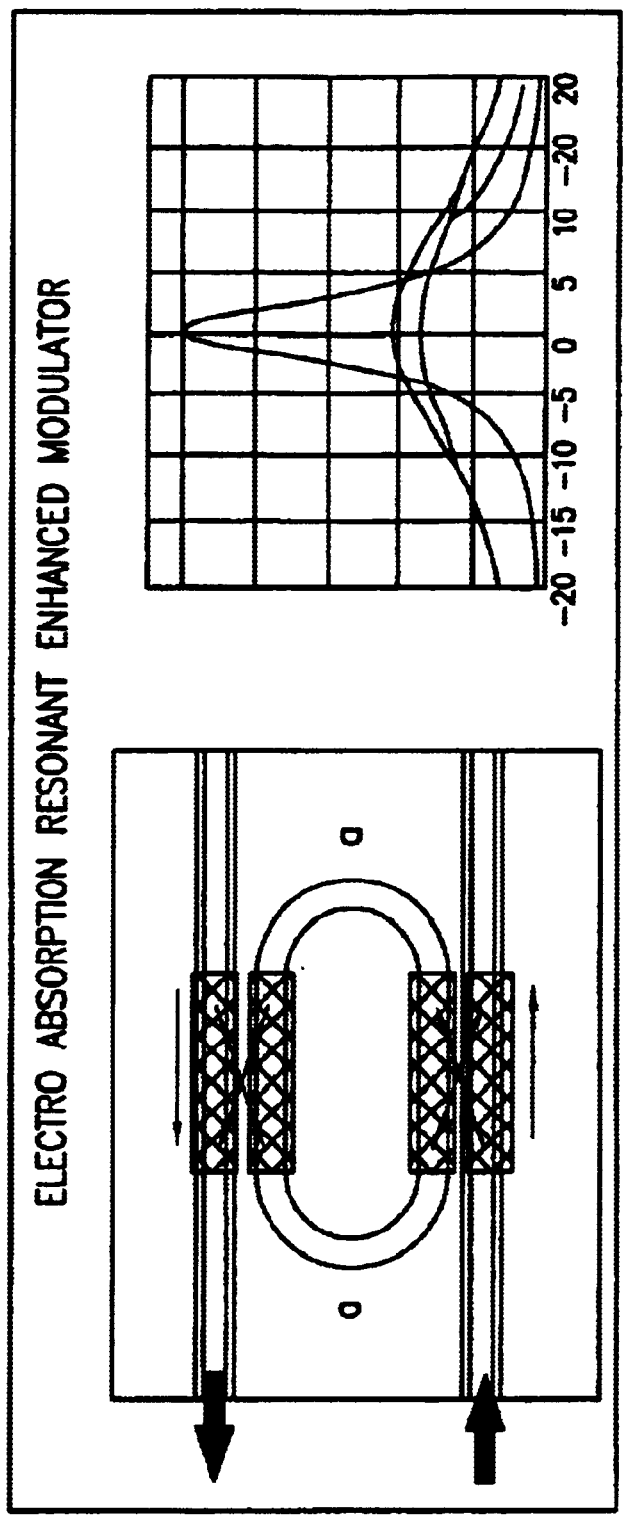
FIG. 2 illustrates a general dual-coupled electro-optic resonant optical element suitable for use in combination with the present invention and operational characteristics thereof.

Referring now also to FIG. 2, REMs further exhibit resonance peaks widths that are closely related to modulation bandwidth. Larger resonators with narrower resonances and greater modulation efficiency exhibit longer photon lifetimes which limit modulation bandwidth. The width of the resonance peak, therefore, denotes the bandwidth of the modulated signal that can pass through the modulator in addition to the bandwidth of electro-optic modulation that can be achieved.

Figure 3:
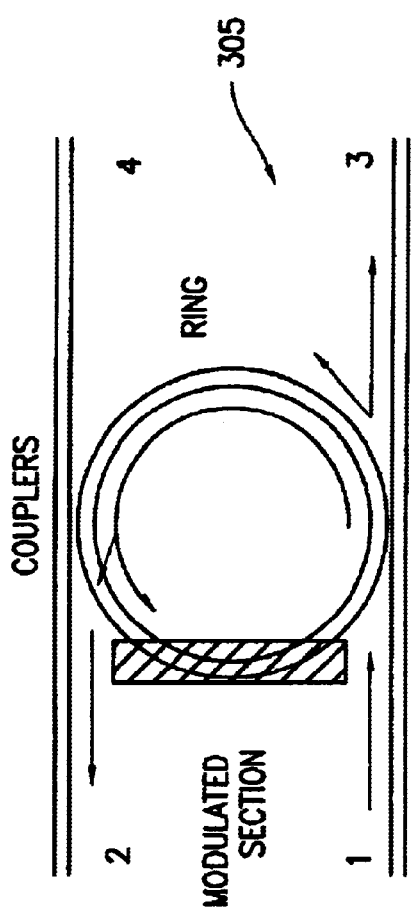
FIG. 3 illustrates a dual-coupled electro-optic ring resonant optical element suitable for use in combination with the present invention and operational characteristics thereof.
Figure 3:
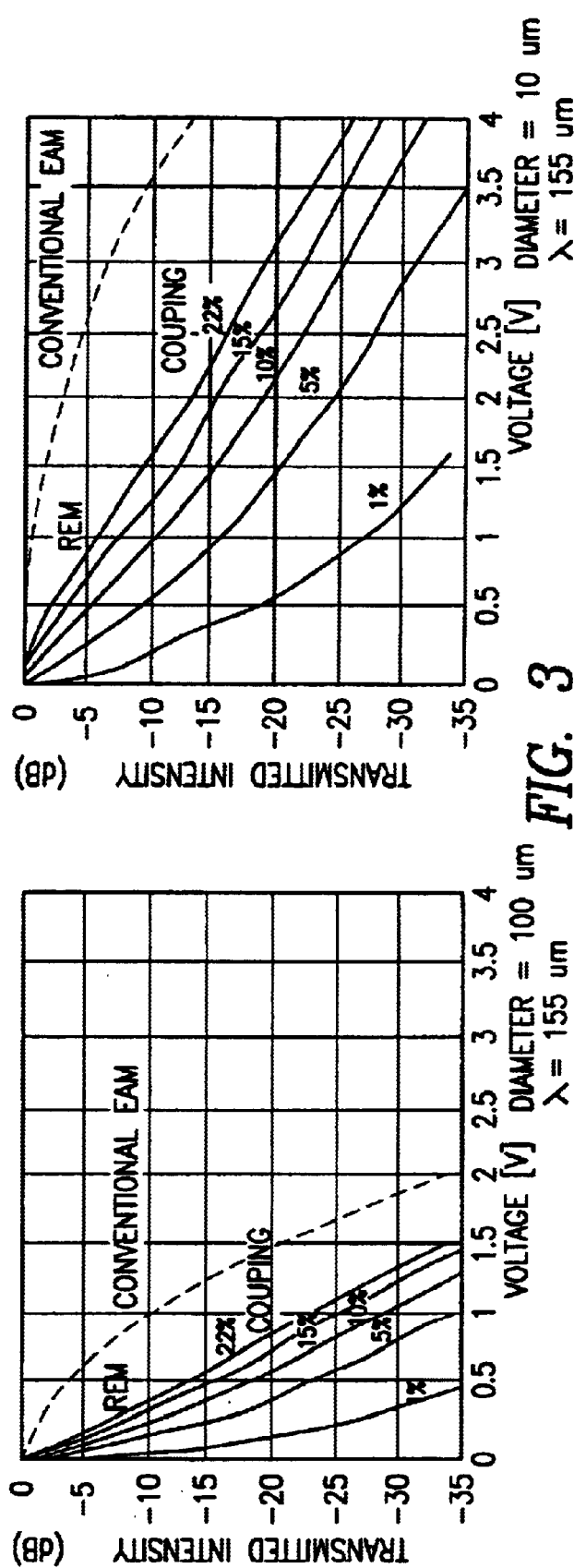

Referring now also to FIG. 3, Electorefractive REMs (ER-REMs) such as that designated 305 can further advantageously be utilized. Resonant enhancement demands propagation losses well below coupling; for a 5% coupler, <1% (cf. FIG. 3). Bending loss is negligible for deep-etched waveguides, mode mismatch is minimized by proper design and material loss is insignificant for small rings. Scattering must be minimized by smooth lithography. Mask edge and sidewall integrity degradation during etching should be minimized.

Manufacturable conditions for transfer of nanometer-scale geometries, based on $CH_4/H_2$ reactive ion etching (RIE), or inductively coupled plasma (ICP) RIE, or chemically assisted ion beam etching (CAIBE), employing $Cl_2$/Ar-ion beams or plasmas can be used.

Modulation index per unit applied voltage can be optimized for a given bandwidth by permitting the optical wave to re-use a given electrode region on multiple passes. Exploitation of the same basic strategy at a lower level of re-use has been reported employing a double-pass configuration by Oki Electric Industry, Tokyo, Japan. In this case a rather significant improvement in efficiency is realized at the cost of necessitating an optical circulator for a double-pass configuration. According to the present invention, dramatic improvements in efficiency are obtained from the application of a similar strategy, however a far superior vehicle of micro-optical ring resonators fabricated in, preferably, InP-based materials is used.

It is a feature of ring resonators, as opposed to the more frequently used Fabry-Perot resonator, that input and output waves can be separated even at a single port of the resonator. In addition, the resonant ring cavity allows a given electrode to be reused not merely twice, as in the Oki work, but 10 times if photons are trapped for, on average, 10 revolutions. Such is the case when coupling of less than 10% exists between the ring and input/output coupled waveguides. Tiny resonators of diameter 10 μm or smaller can be fabricated with low loss in high index materials such as InP owing to the strong confinement that can be obtained when the high index contrast exists between waveguide and surrounding material. In fact, the limitation on the number of turns taken on average by each photon in the ring cavity is due to the bandwidth requirement, which is alleviated as the resonators are made increasingly smaller.

Currently, a diameter of approximately 6 μm is attainable for a ring resonator. This value originates from the introduction of significant bending losses for tighter turns. The five sources of loss for ring resonators are: bending loss (minimized for high index contrast), scattering loss (dependent on the quality of fabrication), material loss (dependent on epitaxial design and the presence of carriers), and mode-matching loss (resulting from abrupt joints between dissimilar waveguides), and from the presence of continuum modes to which a guide mode may couple. All five sources of loss can be minimized by optimum design and fabrication techniques to obtain the high quality resonators described above.

Figure 4:
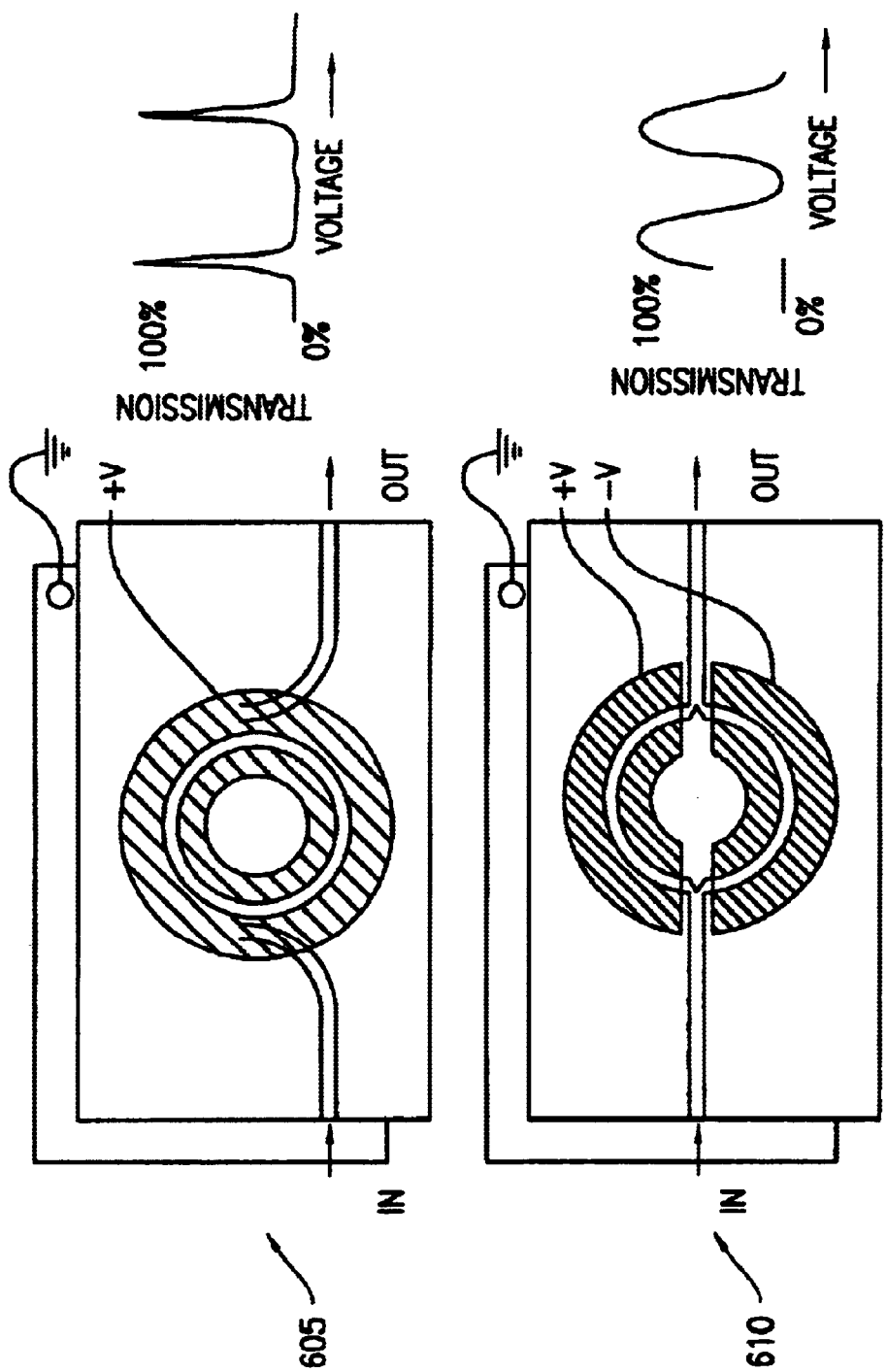
FIG. 4 illustrates a side-by side comparison of electro-optic ring and conventional Mach-Zehnder modulators.

Referring now also to FIG. 4, comparison of a ring resonator 605 to a conventional Mach-Zehnder interferometric modulator 610 reveals that for a given electrode size the dependence of transmission through the structure is far sharper for the ring resonator. There we have sketched the two optical topologies in a similar scale configuration to better explain our view of their similarities and differences. Note that the dependence on applied voltage is significantly more sensitive at resonance for the ring modulator design, but sensitivity is obtained at a proportionate limitation of bandwidth due to the lumped electrode element. In fact, when properly compared on an equal bandwidth basis, there is no voltage advantage for the ring resonator modulator whatsoever. This can be understood through consideration not of electrode length but of dwell time of photons within the index-modulated medium.

The dwell time of photons within the modulating element, also known as the photon lifetime, uniquely determines both bandwidth and phase shift for a given material structure regardless of whether the photons recycle through the same medium (as for a ring modulator) or visit a given region only once (as for a conventional straight waveguide modulator). A key difference is that photons dwell longer in the ring resonator. Modulation bandwidth is determined by the characteristic dwell time. Therefore, the aforementioned reduction in drive voltage is obtained at a steep cost of reduction in bandwidth. Consequently there can be no advantage attained for a single resonator structure over a non-resonant modulator. This is a basic feature of such structures and derives from fundamental physical principles.

In this connection, there obtains no advantage in drive voltage for a single-element resonant modulator over a conventional modulator configuration when proper comparison is made between resonant and conventional modulators of equal bandwidth. This limitation has been noticed by experts in the field and sophisticated customers for high-efficiency modulators, and has quite possibly hampered the development of legitimate resonant modulation schemes such as those proposed here.

The advantage realized for the ring resonator is the reduced capacitance that is the basis of the approaches discussed herein.

A key feature, however, does remain for resonant modulators: size. Along with size goes capacitance since the smaller resonant modulator has lesser junction area and capacitance is proportional to that area. For a resonant modulator in which the photon lifetime is 10 times the round-trip time, a size and capacitance advantage of 10 times is obtained. In addition, as the ring structure is made smaller the need for deep etching to maintain low bending loss also provides for smaller cross-section and small capacitance, everything else being equal for single-mode waveguides. Thus, the loading of drive circuitry is significantly lower for the resonant modulator, and capacitances of on the order of 0.01 pF or less are anticipated for a 10 gm diameter ring, as opposed to greater than 0.1 pF for conventional electro-absorption modulators.

Figure 5:
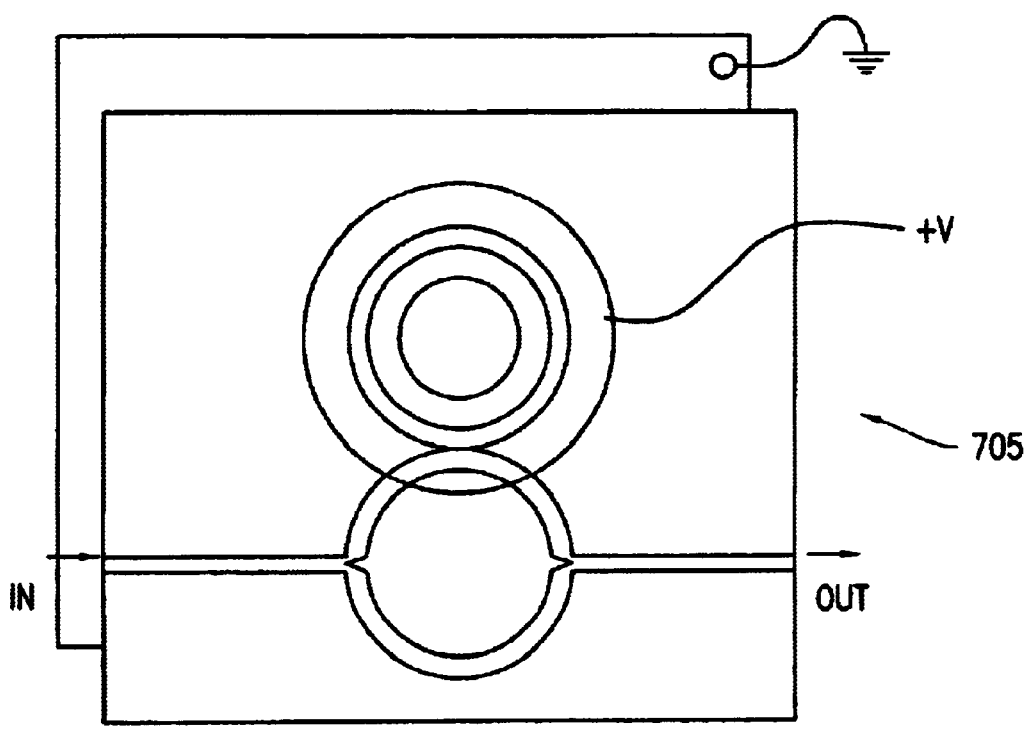
FIG. 5 illustrates a single- or side-coupled ring resonator incorproated within a Mach Zehnder modulator.

Referring now also to FIG. 5, in addition to the ring interferometer of FIG. 4, a resonator 705 which induces a phase shift in a waveguide to which it is evanescently coupled can be used. In such a side-coupled waveguide, a relative phase shift of ±π occurs about the resonance center as either signal wavelength is scanned or the resonance condition of the ring is tuned for a fixed wavelength. Ideally, in the case of relatively low loss in the ring structure, low loss is induced to the main waveguide at resonance and even in the presence of ring loss no excess loss at all is encountered when off-resonance. This is a desirable feature for manufacturability since it sidesteps difficult-to-perform coupling alignments to opaque waveguides.

A key feature of the configuration of FIG. 5 is high return loss for light traveling in the side-coupled waveguide that makes up one arm of the Mach-Zehnder, and that this occurs in a configuration providing modulation of the index rather than of the absorption. Index modulation is preferred for reasons including greater immunity to saturation, which is a particular issue for microresonators. This is because the optical intensity is multiplied 10-fold for a typical microresonator design, and because 10's of milliwatts or greater are desired to be modulated. Therefore, 100 mW power levels will circulate within the microresonator. Such powers may be inconsistent with unsaturated operation of intensity modulation.

Figure 6:
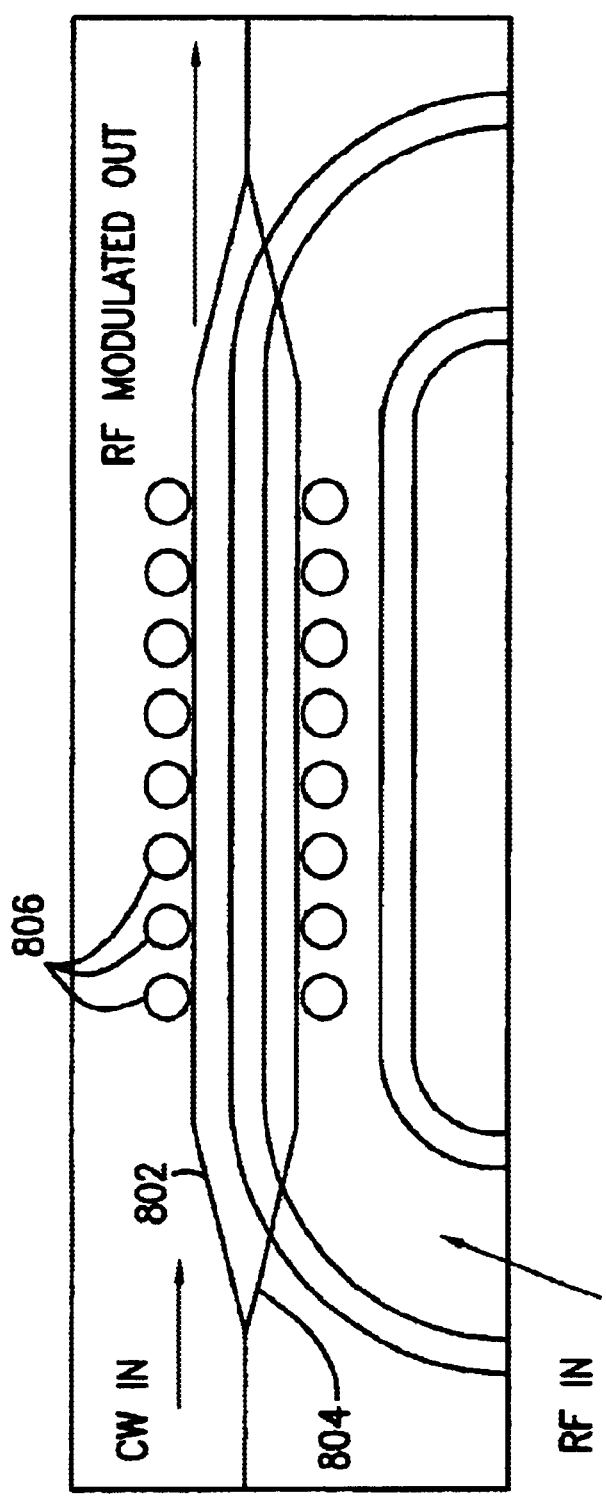
FIG. 6 illustrates a schematic of an electro-refractive Mach-Zehnder REM according to an aspect of the present invention.

Referring now to FIG. 6, because of the high return loss, it is possible to gang together multiple such side-coupled rings 806 in series to obtain a very high efficiency of index modulation. Because of the very low return loss, it is possible to simply aggregate the phase delay. Because of the very low capacitance, each resonator hardly loads a microwave transmission line. The reactance associated with 0.01 pF amounts to 1500 j Ω at 10 GHz, which is much more forgiving than 100 j Ω or less of the equivalent conventional modulator.

The complex modulation index for such a configuration in the side-coupled guide is:

$$\frac{E_o}{E_i} = \frac{r - Le^{-i\phi}}{1 - rLe^{-i\phi}}$$

And consequently intensity transmission is:

$$\frac{I_0}{I_i} = \frac{r^2 - 2rL\cos(\phi) + L^2}{1 - 2rL\cos(\phi) + r^2L^2}$$

where: the loss in one round-trip is $L=\exp(-\alpha L_a)$, the phase change in one round-trip is $\phi=\beta L_a$, the propagation constant is $\beta=n\omega/c$, $L_a$ being the circumference of the ring, and a its radius.

As the electro-refractive effect is applied progressively, the center resonance sweeps over the optical frequency range, and if the side-coupled ring were included in only one of the two Mach-Zehnder arms 802, 804 this feature would render it impractical over the desired bandwidth, such that only a portion of the resonance would receive constructive interference at the Mach-Zehnder output. However, by placing side-coupled rings in push-pull format on both arms 802, 804 of the Mach-Zehnder, as depicted in FIG. 6, a passband is created with the width of the resonance over which a constant phase difference exists between the two arms.

Figure 7:
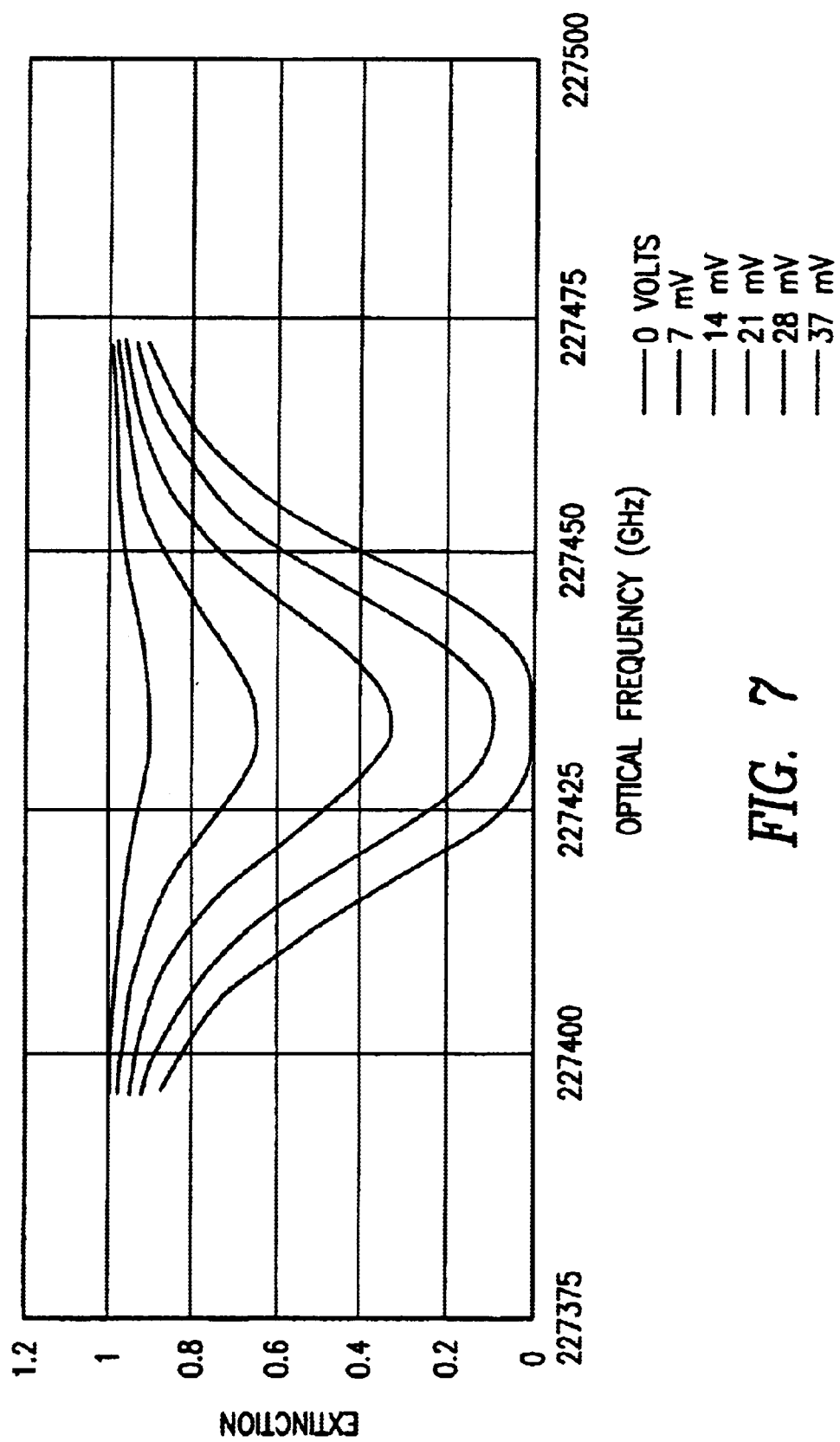
FIG. 7 illustrates operation characteristics of the modulator of FIG. 6.

FIG. 7 shows the passband for such an electro-refractive Mach-Zehnder REM, and it can be seen that the width of the passband for the 10 μm diameter ring resonators is ample for a 10 GHz modulation signal, extending as it does over the width of the resonance.

Referring again to FIG. 6, eight microresonators are side-coupled to each of the two Mach-Zehnder arms 802, 804. The modulator of FIG. 6 includes multiple branches or arms 802, 804. Each of the arms 802, 804 is connected to either a top or bottom RF electrode. A plurality of RF delay elements (not shown) delay the propagation of electrical signals down the modulator to be substantially synchronized with optical signals propagating down the modulator. A plurality of electro-refractive resonant elements 806, in the case of FIG. 6, 8 ring resonators, are coupled to the delay elements in each of the branches 802, 804. Each of the resonant elements 806 are further evanescently coupled to one of the multiple branches, or arms 802, 804. In other words, the electro-refractive Mach-Zehnder REM device of FIG. 6 uses a coplanar type of microwave waveguide as a feed for multiple low-capacitive rings which are side-coupled to the waveguides of a Mach-Zehnder interferometer in waveguide form. The delay elements encountered at each ring is compensated by delay of either a slow-wave transmission line structure, by a meander line or by lumped-element delays, for example. According to another aspect of the present invention, the RF electrodes are configured in a push-pull configuration.

The remarkable feature of this modulator is that complete extinction is obtained in 37 meV, two orders of magnitude more sensitively than is possible for conventional technology. As noted in FIG. 7, this modulator configuration was evaluated explicitly for 1.310 $\mu$m (i.e., 227.4 THz), but very similar results obtain at 1.55 $\mu$m.

Figure 8:
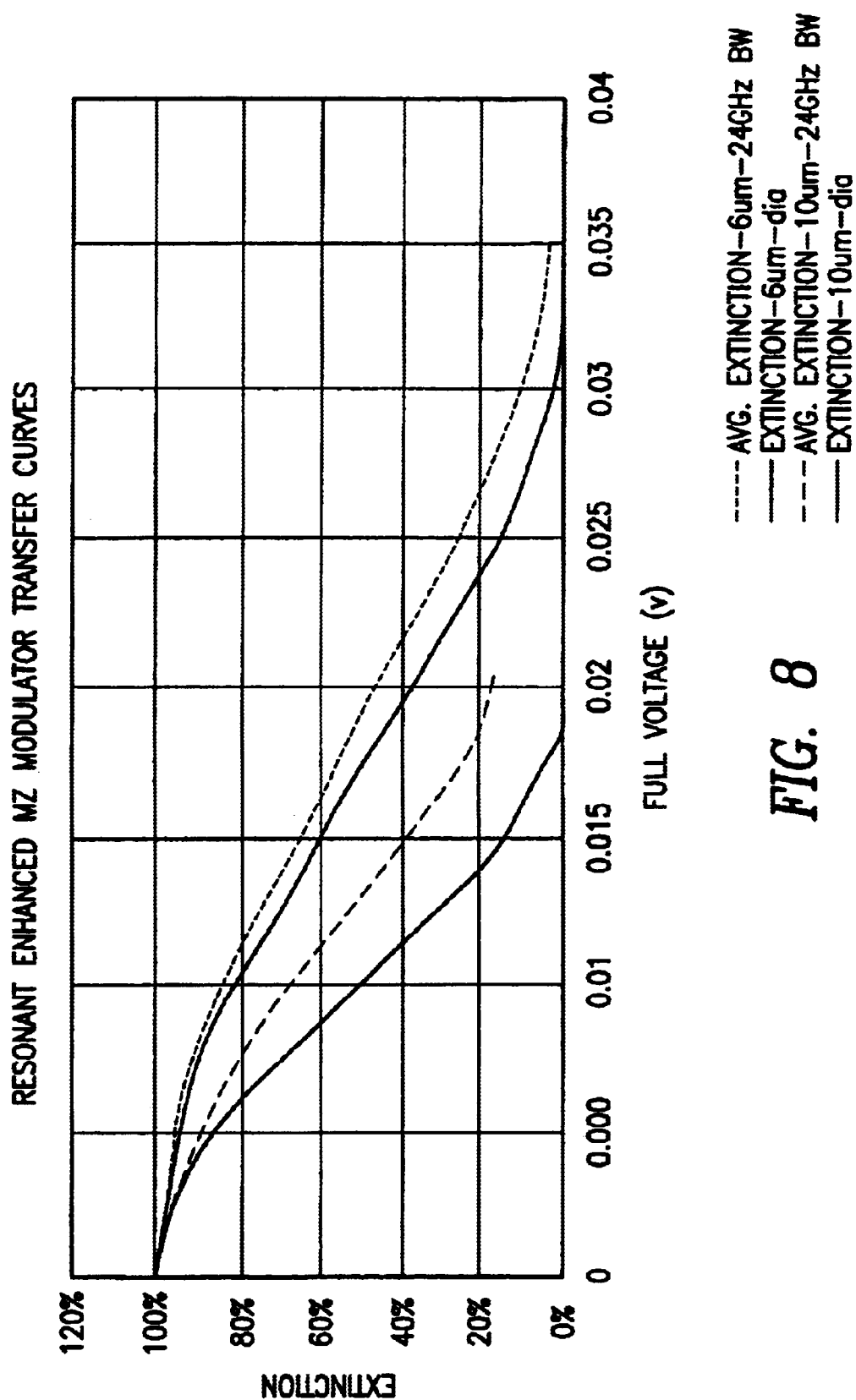
FIG. 8 illustrates operational characteristics of a resonant enhanced Mach-Zehnder modulator according to another aspect of the invention.

Referring again to FIG. 7, the vertical grid lines thereof denote 25 GHz intervals. The operation of each ring modulator must allow for sufficient passband to permit the sidebands generated by modulation of the optical carrier to pass within the modulation band. FIG. 8 compares the average extinction over a 24 GHz bandwidth to that of a single-optical frequency versus applied voltage for two different ring diameters. It is not surprising that a 6 $\mu$m diameter ring, with its shorter photon lifetime and consequently higher bandwidth, more nearly duplicates responses between the broadband behavior and single optical frequency behavior than does the larger, narrower bandwidth 10 $\mu$m diameter device.

Figure 9:
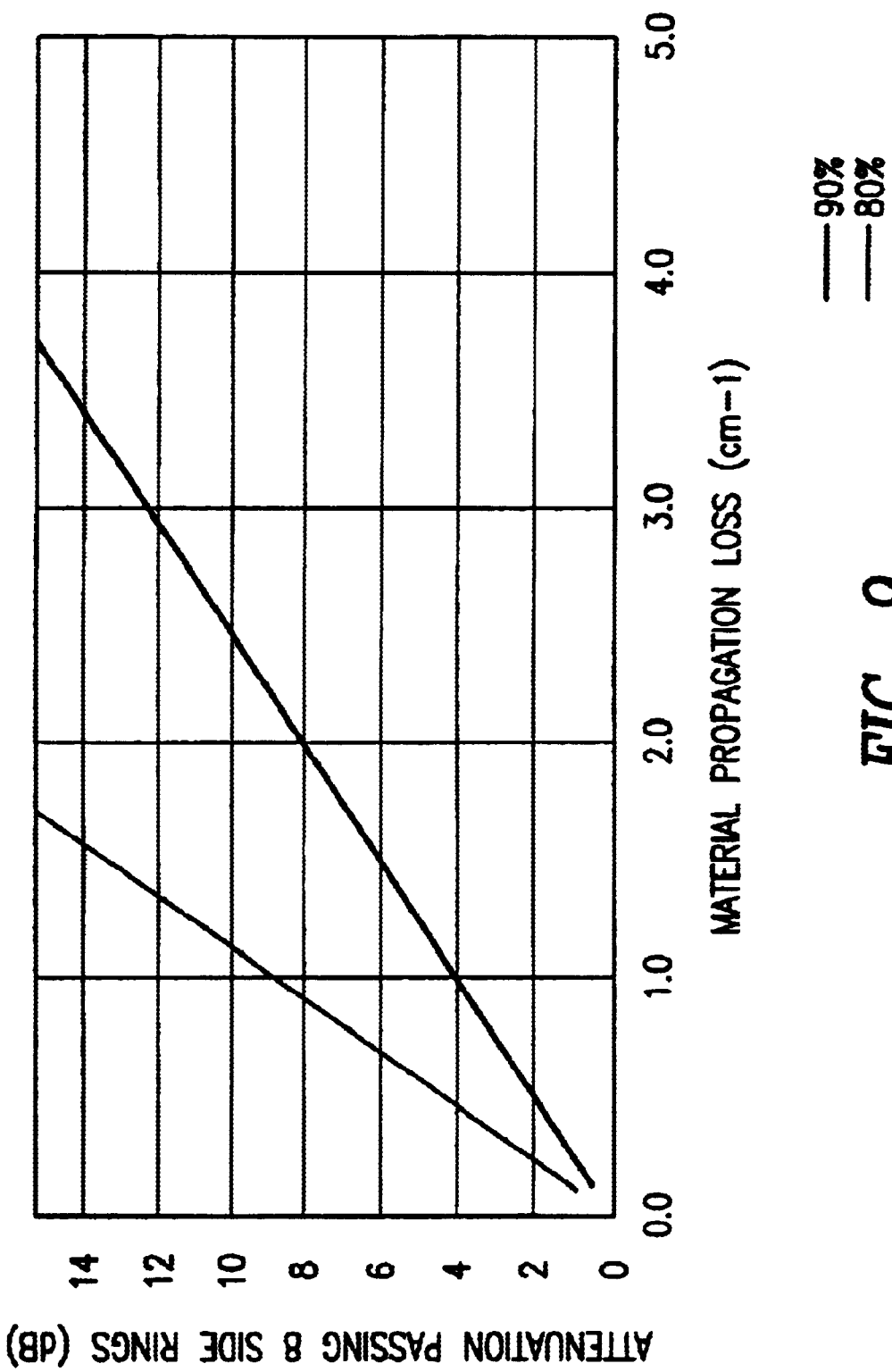
FIG. 9 illustrates required material propagation losses for electro-refractive ring resonant elements of the modulator of FIG. 6 according to an aspect of the invention.

Cascading of multiple resonators in series, as proposed here, can only be successful if the loss associated with each is small. This requirement is quantitatively evaluated as shown in FIG. 9. As seen there, losses in the waveguides must be below 2 cm$^{-1}$ (preferred below 1 cm$^{-1}$) to achieve the desired throughput of better than 6 dB for 8-ganged ring modulators. Losses are one of the key issues, and their minimization depends on proper design of the semiconductor material, proper device design, and proper selection of operation wavelength. It is to be anticipated that for wavelengths close to the quantum well bandgap there will be greater residual material losses tailing from the interband resonance. It is reasonable to anticipate that lower background losses will obtain where reversed biased junctions are employed and carriers are swept out. The residual interband absorption tailing can be minimized by careful heterostructure design, and choice of operating wavelength.

According to another aspect of the present invention, another strategy for counteracting loss is the introduction of a small amount of optical gain provided at a slightly shorter wavelength by the same optical fiber connection that carries the signal. Finally, stabilization of the correct amount of gain is desirable because excessive gain is associated with narrowing of the resonance and would not support 4 GHz bandwidths.

An ER-REM Mach-Zehnder Modulator can modulate up to 20 mW. Only 6 dB of loss is anticipated using smooth waveguide walls and mode expansion couplers. These modulators will be highly polarization-dependent to achieve minimum voltage. Temperature will can be stabilized using a conventional TE cooler arrangement.

Passive microwave matching circuitry is a key element for enhancement of the resonant enhanced modulator (REM) performance, as shown in FIG. 1. The low capacitance of a the REM permits a matching circuit to act as a transformer, stepping up the voltage to the REM electrodes owing to the minimal current drawn by the REM.

Figure 10:
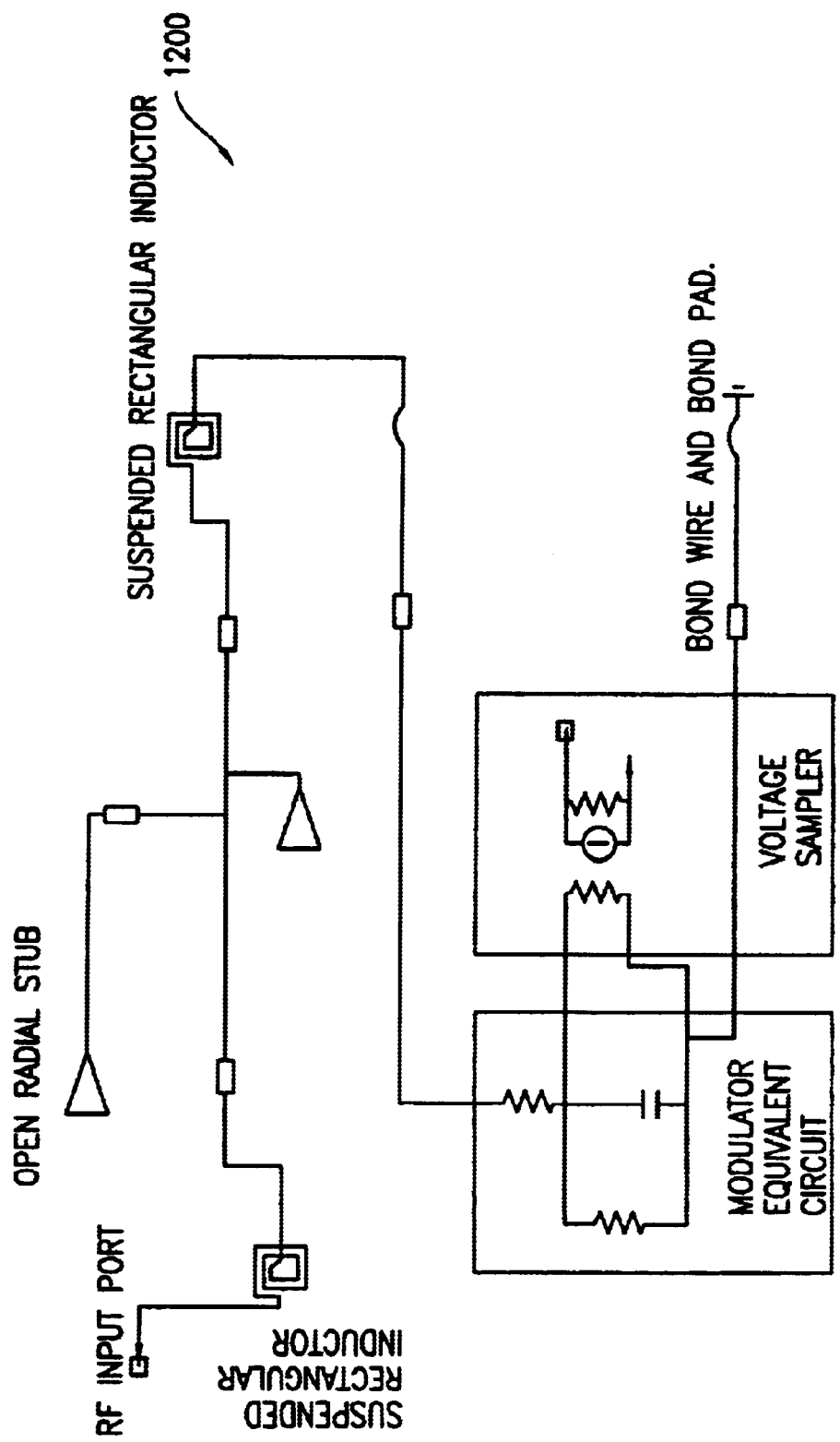
FIG. 10 illustrates a schematic representation of an equivalent circuit of a matching network and REM according to another aspect of the invention.
Figure 11:
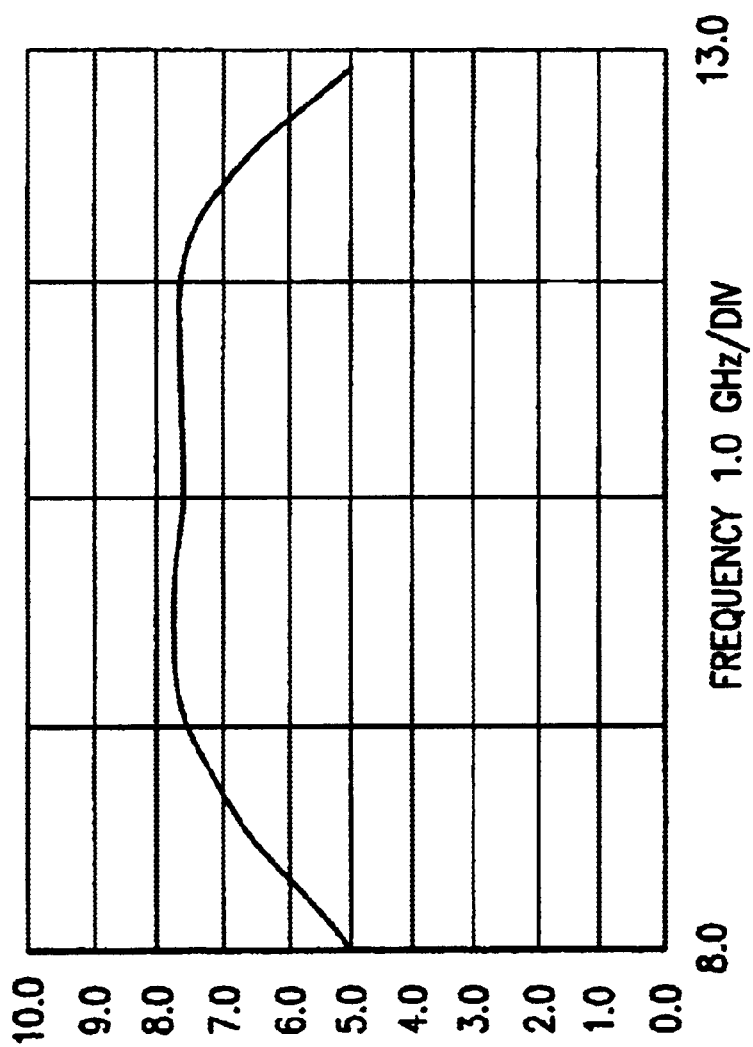
FIG. 11 illustrates an achievable performance enhancement according to an aspect of the present invention; and, FIG. 12 illustrates a design layout of a combined antenna, matching network and REM device utilizing a microwave ridge waveguide to effect impedance transformation from 377Ω of free space to a 50Ω microstrip line according to an aspect of the present invention.
Figure 12:
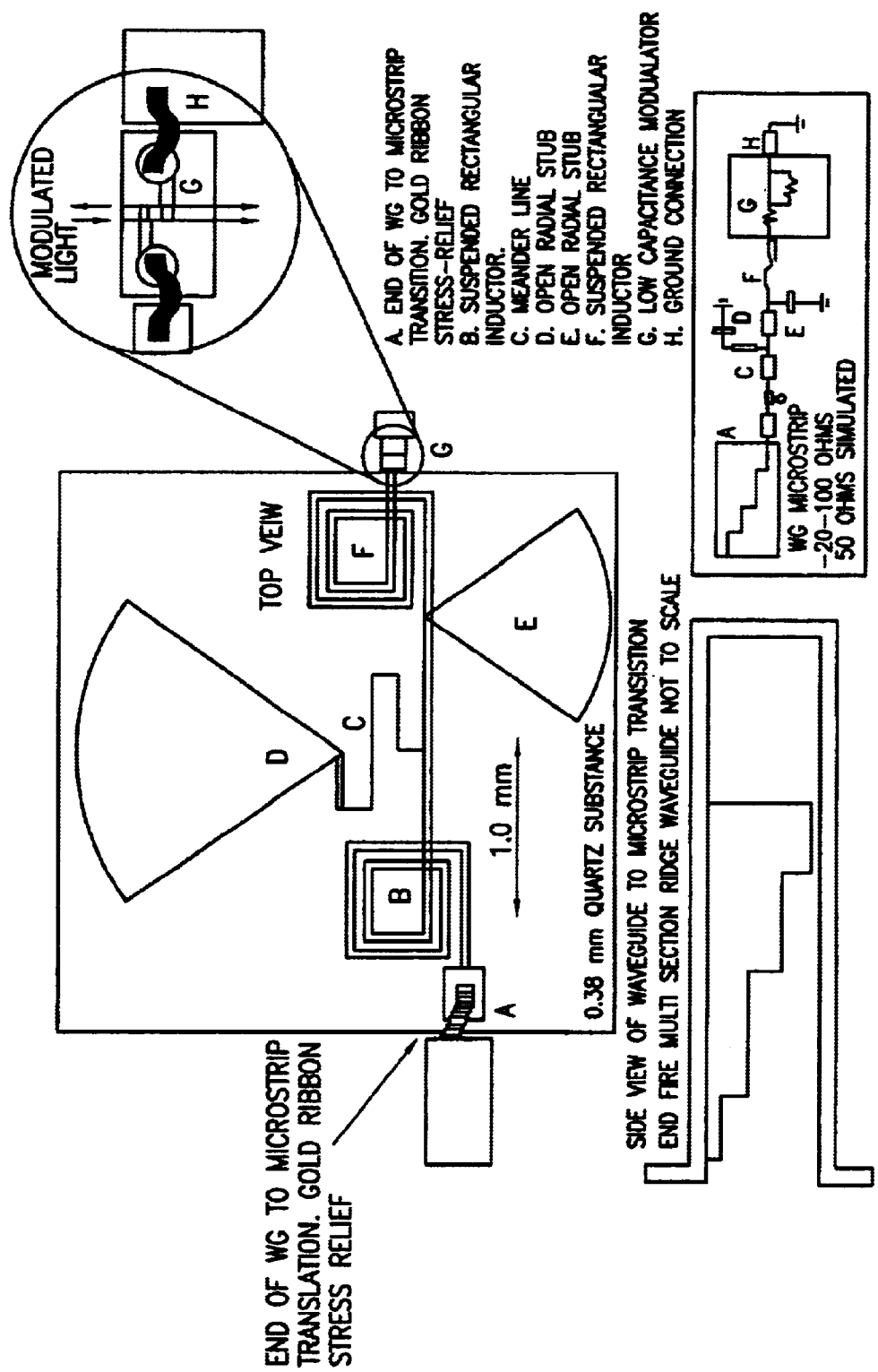

According to another aspect of the present invention, an equivalent circuit model 1200 is shown in FIG. 10. Referring now also to FIG. 11, it has been found that an 8 dB passive gain can be achieved. Referring now also to FIG. 12, a circuit layout is shown therein suitable for this equivalent circuit analysis employing waveguide for low loss and to achieve the transition from free space to the REM input. This represents the third resonance which is appropriate for non-base-band applications in the RF domain.

Assuming that the 8 dB gain can be applied to the 37 mV modulator, the $V_\pi$ that results is 7 mV. However, the matching circuit could be used with a more conventional 2 V modulator to achieve 0.32 V operation.

Although the invention has been described and pictured in a preferred form with a certain degree of particularity, it is understood that the present disclosure of the preferred form, has been made only by way of example, and that numerous changes in the details of construction and combination and arrangement of parts may be made without departing from the spirit and scope of the invention as hereinafter claimed. It is intended that the patent shall cover by suitable expression in the appended claims, whatever features of patentable novelty exist in the invention disclosed.

I claim:

1. A modulator comprising:
   a plurality of branches;
   first and second RF electrodes;
   a first plurality of RF delay elements coupled to said first RF electrode and a second plurality of RF delay elements coupled to said second electrode; and,
   a plurality of electro-refractive resonant elements each being respectively coupled to a corresponding one of said RF delay elements and evanescently coupled to at least one of said branches.

2. The modulator of claim 1, wherein said modulator is an interferometer.

3. The modulator of claim 2, wherein said interferometer is a Mach Zehnder interferometer.

4. The modulator of claim 1, wherein electrical and optical signals propagating down said branches are substantially synchronized.

5. The modulator of claim 1, wherein said RF delay elements substantially synchronize electrical signals propagating through said device with optical signals propagating through said device.

6. The modulator of claim 1, wherein capacitive properties of each of said resonant elements is substantially negligible so as not to electrically load either of s RF inputs.

7. The modulator of claim 1, wherein each of said resonant elements comprises a ring resonator.

8. The modulator of claim 7, wherein each of said ring resonators is an elongated ring resonator.

9. The modulator of claim 1, wherein said modulator is an electro-refractive Mach-Zehnder device and each of said branches is an arm of said device.

10. The modulator of claim 1, wherein said RF electrodes are configured in a push-pull configuration.

* * * * *